(12) United States Patent
Hasegawa et al.

(10) Patent No.: US 7,528,032 B2
(45) Date of Patent: May 5, 2009

(54) METHOD FOR MANUFACTURING SEMICONDUCTOR DEVICE

(75) Inventors: Hisashi Hasegawa, Chiba (JP); Jun Osanai, Chiba (JP)

(73) Assignee: Seiko Instruments Inc. (JP)

( * ) Notice: Subject to any disclaimer, the term of this patent is extended or adjusted under 35 U.S.C. 154(b) by 438 days.

(21) Appl. No.: 10/398,035

(22) PCT Filed: Jun. 18, 2002

(86) PCT No.: PCT/JP02/06072

§ 371 (c)(1),
(2), (4) Date: Jun. 30, 2003

(87) PCT Pub. No.: WO03/001592

PCT Pub. Date: Jan. 3, 2003

(65) Prior Publication Data

US 2005/0074929 A1    Apr. 7, 2005

(30) Foreign Application Priority Data

Jun. 21, 2001   (JP) ............................. 2001-188050

(51) Int. Cl.
*H01L 21/8234* (2006.01)
(52) U.S. Cl. ................... 438/238; 438/151; 438/155; 438/200; 257/E21.004; 257/E21.598
(58) Field of Classification Search .......... 438/197, 438/199, 200, 210, 218, 223–224, 227–229, 438/238, 294, 297, 299, 301, 308, 795, 151; 438/155; 257/E21.004, E21.598

See application file for complete search history.

(56) References Cited

U.S. PATENT DOCUMENTS

| | | | | | |
|---|---|---|---|---|---|
| 5,449,637 | A | * | 9/1995 | Saito et al. | 438/227 |
| 5,489,547 | A | * | 2/1996 | Erdeljac et al. | 438/238 |
| 5,610,089 | A | * | 3/1997 | Iwai et al. | 438/210 |
| 5,618,749 | A | * | 4/1997 | Takahashi et al. | 438/384 |
| 5,773,339 | A | * | 6/1998 | Okamoto | 438/210 |
| 5,953,599 | A | * | 9/1999 | El-Diwany | 438/199 |
| 5,959,343 | A | * | 9/1999 | Harada et al. | 257/528 |
| 6,110,772 | A | * | 8/2000 | Takada et al. | 438/238 |
| 6,130,138 | A | * | 10/2000 | Oh | 438/393 |
| 6,204,105 | B1 | * | 3/2001 | Jung | 438/238 |
| 6,207,484 | B1 | * | 3/2001 | Kim et al. | 438/209 |
| 6,768,174 | B2 | * | 7/2004 | Hasegawa et al. | 257/350 |
| 6,777,754 | B2 | * | 8/2004 | Shiiki | 257/358 |
| 6,797,554 | B2 | * | 9/2004 | Katayama | 438/210 |

OTHER PUBLICATIONS

Stanley Wolf and Richard N. Tauber, Silicon Processing For The VLSI Era, 2000, Lattice Press, Second Edition, pp. 180-207, 340-347, and 829-837.*

* cited by examiner

*Primary Examiner*—Charles D. Garber
*Assistant Examiner*—Stanetta D Isaac
(74) *Attorney, Agent, or Firm*—Adams & Wilks (57) ABSTRACT

In a method of manufacturing a semiconductor device, a polycrystalline silicon film is deposited on a gate insulating film formed over a substrate and is doped with a P-type impurity to form the first polycrystalline silicon film with a P-type conductivity. A high melting point polycide film is deposited on the P-type first polycrystalline silicon film. The P-type first polycrystalline silicon film, high melting point metallic polycide film, and insulating film are etched to form a gate electrode. A second polycrystalline silicon film different from the P-type first polycrystalline silicon film is deposited on the substrate. The second polycrystalline silicon film is etched to form a resistor composed of the second polycrystalline silicon film.

19 Claims, 6 Drawing Sheets

METHOD FOR MANUFACTURING SEMICONDUCTOR DEVICE

CROSS-REFERENCE TO RELATED APPLICATIONS

This application is a U.S. national state application of copending International Application Ser. No. PCT/JP02/006072, filed Jun. 18, 2002 claiming a priority date of Jun. 21, 2001, and published in a non-English language.

BACKGROUND OF THE INVENTION

1. Field of the Invention

The present invention relates to a method of manufacturing a complementary MOS semiconductor device having a resistor circuit, for which low voltage operation, low power consumption, and high drive power are required. In particular, the present invention relates to a power management semiconductor device such as a voltage detector (hereinafter referred to as a VD), a voltage regulator (hereinafter referred to as a VR), or a switching regulator (hereinafter referred to as an SWR), or an analog semiconductor device such as an operational amplifier or a comparator.

2. Background Information

Figure 12:
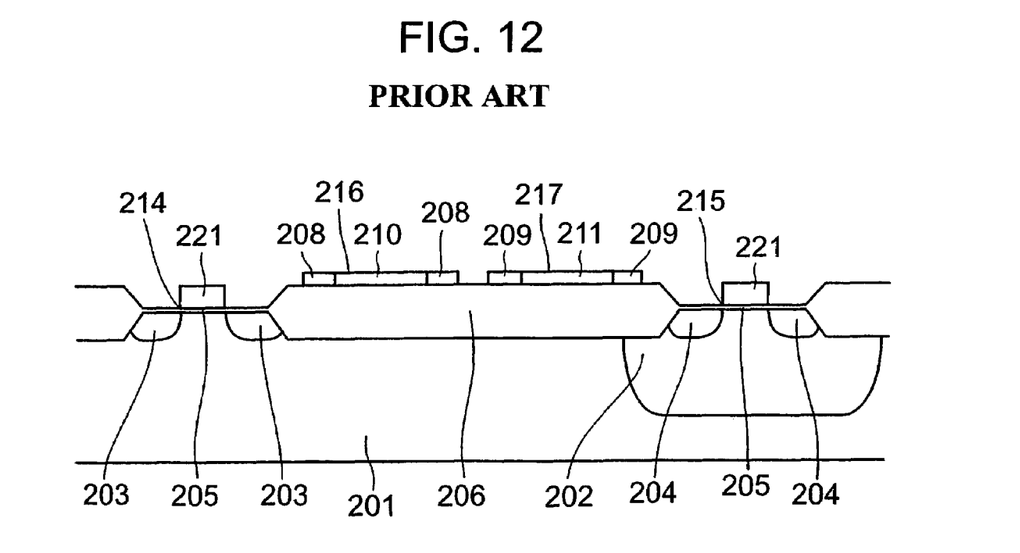
FIG. 12 is a schematic cross sectional view showing an embodiment of a conventional CMOS semiconductor device.

Conventionally, many kinds of complementary MOS semiconductor devices having a resistor circuit using a resistor made of polycrystalline silicon or the like are used. FIG. 12 shows an example of a structure of a conventional semiconductor device having a resistor circuit. There is formed a complementary MOS (hereinafter referred to as a CMOS) structure which is comprised of an N-channel MOS (hereinafter referred to as an NMOS) transistor 214 in which a gate electrode 221 formed on a gate insulating film 205 of a P-type semiconductor substrate 201 is made of N$^+$-type polycrystalline silicon, and a P-channel MOS (hereinafter referred to as a PMOS) transistor 215 in which the gate electrode 221 formed to an N-well region 202 is also made of N$^+$-type polycrystalline silicon. There are formed impurity diffusion layers 203 and 204 as components of MOS transistors 214 and 215. There are formed resistors 216 and 217 used for a voltage dividing circuit for dividing a voltage, a CR circuit for setting a time constant, or the like, which are formed on a field insulating film 206. These components constitute a resistor circuit. Here, the resisters 216 and 217 are respectively composed of high concentration impurity regions 208 and 209 and high resistance regions 210 and 211.

In the complementary MOS (CMOS) semiconductor device having the resistor circuit, the N$^+$-type polycrystalline silicon is often used for the gate electrode in view of a polarity thereof because of ease and stability of the manufacturing operation. In this case, from a relationship of work functions between the gate electrode and the semiconductor substrate (well), the NMOS transistor becomes a surface channel type NMOS transistor. On the other hand, in the case of the PMOS transistor, a threshold voltage becomes about −1 V also from the relationship of work functions between the gate electrode and the semiconductor substrate. Thus, when impurity implantation is conducted for reducing the threshold voltage, the PMOS transistor becomes a buried channel type PMOS transistor in which a channel is formed in the inner portion of the substrate, which is slightly deeper than the surface thereof. The buried channel type transistor has an advantage of high mobility because a carrier is transferred through the inner portion of the substrate. However, when the threshold voltage is reduced, a subthreshold characteristic is greatly deteriorated, thereby increasing a leak current. Thus, it is difficult for the PMOS transistor to reduce a voltage and shorten a channel as compared with the NMOS transistor.

Also, as a structure capable of reducing a voltage in both the NMOS transistor and the PMOS transistor, there is a homopolar gate structure in which the polarity of the gate electrode is set to be equal to that of the transistor. According to this structure, N$^+$-type polycrystalline silicon is used for the gate electrode of the NMOS transistor and P$^+$-type polycrystalline silicon is used for the gate electrode of the PMOS transistor. Thus, each transistor becomes a surface channel type transistor. As a result, a leak current can be suppressed and a voltage can be reduced. However, there are the following problems in costs and characteristics. That is, when the gate electrodes having different polarities are formed, the number of manufacturing steps is thereby increased and increases in a manufacturing cost and a manufacturing period are caused. Further, with respect to an inverter circuit as a most fundamental circuit element, generally, in order to improve area efficiency, the layout for the gate electrodes of the NMOS transistor and the PMOS transistor is made such that a connection through metal is avoided and a piece of polycrystalline silicon which is two-dimensionally continued from the NMOS transistor to the PMOS transistor or a polycide structure composed of a laminate of a polycrystalline silicon film and a high melting point metallic silicide film is used. However, when the gate electrode is made of polycrystalline silicon as a single layer, it is impractical because of a high impedance of a PN junction in the polycrystalline silicon. Also, when the gate electrode has a polycide structure, an N-type impurity and a P-type impurity each are diffused to respective gate electrodes having an inverse conductivity type through high melting point metallic silicide films at high speed during heat treatment in manufacturing steps. As a result, a work function is changed and a threshold voltage is unstable.

BRIEF SUMMARY OF THE INVENTION

In order to solve the above-mentioned problems, the present invention adopts the following measures. (1) A method of manufacturing a semiconductor device including the steps of: forming an element isolation insulating film on a semiconductor substrate by thermal oxidation; forming a gate insulating film by thermal oxidation; depositing a first polycrystalline silicon film at a thickness of 500 Å to 2500 Å on the gate insulating film; doping the first polycrystalline silicon film with an impurity such that a concentration of the impurity is $1\times10^{18}$ atoms/cm$^3$ or higher to make a conductivity type of the first polycrystalline silicon film a P-type; depositing a high melting point metallic silicide film having a thickness of 500 Å to 2500 Å on the first polycrystalline silicon film having the P-type; depositing an insulating film having a thickness of 500 Å to 3000 Å on the high melting point metallic silicide film; etching the first polycrystalline silicon film having the P-type, the high melting point metallic silicide film, and the insulating film to form a gate electrode; depositing a second polycrystalline silicon film having a thickness of 500 Å to 2500 Å on the element isolation insulating film; doping an entire region of the second polycrystalline silicon film or a first region of the second polycrystalline silicon film with a first conductivity type impurity at a concentration of $1\times10^{14}$ to $9\times10^{18}$ atoms/cm$^3$; doping a second region of the second polycrystalline silicon film with a second conductivity type impurity at a concentration of $1\times10^{14}$ to $9\times10^{18}$ atoms/cm$^3$; etching the second polycrystalline silicon film to form a resistor composed of the second polycrystalline silicon film; doping the low concentration diffusion region of the first conductivity type MOS transistor with the first conductivity type impurity at a concentration of $1\times10^{16}$ to $1\times10^{18}$ atoms/cm$^3$; doping the low concentration diffusion region of the second conductivity type MOS transistor with the second conductivity type impurity at a concentration of $1\times10^{16}$ to $1\times10^{18}$ atoms/cm$^3$; doping a portion or an entire region of the first region of the second polycrystalline silicon film with the first conductivity type impurity at a concentration of $1\times10^{19}$ atoms/cm$^3$ or higher; performing heat treatment so that the low concentration diffusion region of the first conductivity type MOS transistor and the low concentration diffusion region of the second conductivity type MOS transistor have a region overlapped with the gate electrode; doping a portion or an entire region of the first region of the second polycrystalline silicon film with the first conductivity type impurity at a concentration of $1\times10^{19}$ atoms/cm$^3$ or higher; doping a portion or an entire region of the second region of the second polycrystalline silicon film with the second conductivity type impurity at a concentration of $1\times10^{19}$ atoms/cm$^3$ or higher; forming an intermediate insulating film over the semiconductor substrate; forming a contact hole in the intermediate insulating film over the semiconductor substrate; and providing a metallic wiring in the contact hole.

(2) A method of manufacturing a semiconductor device, characterized in that an impurity introducing method for the first polycrystalline silicon film is for ion implantation of boron.

(3) A method of manufacturing a semiconductor device, characterized in that the impurity introducing method for the first polycrystalline silicon film is for ion implantation of BF$_2$.

(4) A method of manufacturing a semiconductor device, characterized in that the impurity introducing method for the first polycrystalline silicon film is a doped-CVD method of depositing the first polycrystalline silicon film while the impurity is mixed thereinto.

(5) A method of manufacturing a semiconductor device, characterized in that the insulating film deposited on the high melting point metallic silicide film is composed of an oxide film.

(6) A method of manufacturing a semiconductor device, characterized in that the insulating film deposited on the high melting point metallic silicide film is composed of a nitride film.

(7) A method of manufacturing a semiconductor device, characterized in that the insulating film deposited on the high melting point metallic silicide film is composed of a laminate of an oxide film, a nitride film, and another oxide film different from the oxide film.

(8) A method of manufacturing a semiconductor device, characterized in that the step of doping the low concentration diffusion region of the first conductivity type MOS transistor with the first conductivity type impurity at a concentration of $1\times10^{16}$ to $1\times10^{18}$ atoms/cm$^3$ and the step of doping the first conductivity type impurity to the portion and the entire region of the first region of the second polycrystalline silicon film are simultaneously conducted, and the step of doping the low concentration diffusion region of the second conductivity type MOS transistor with the second conductivity type impurity at a concentration of $1\times10^{16}$ to $1\times10^{18}$ atoms/cm$^3$ and the step of doping the second conductivity type impurity to the portion and the entire region of the second region of the second polycrystalline silicon film are simultaneously conducted.

(9) A method of manufacturing a semiconductor device, characterized in that doping of the first conductivity type impurity at a concentration of $1\times10^{19}$ atoms/cm$^3$ or higher to the portion and the entire region of the first region of the second polycrystalline silicon film is performed simultaneously with doping to a diffusion region of the first conductivity type MOS transistor, and doping of the second conductivity type impurity at a concentration of $1\times10^{19}$ atoms/cm$^3$ or higher to the portion and the entire region of the second region of the second polycrystalline silicon film is performed simultaneously with doping to a diffusion region of the second conductivity type MOS transistor.

DETAILED DESCRIPTION OF THE PREFERRED EMBODIMENTS

Figure 1:
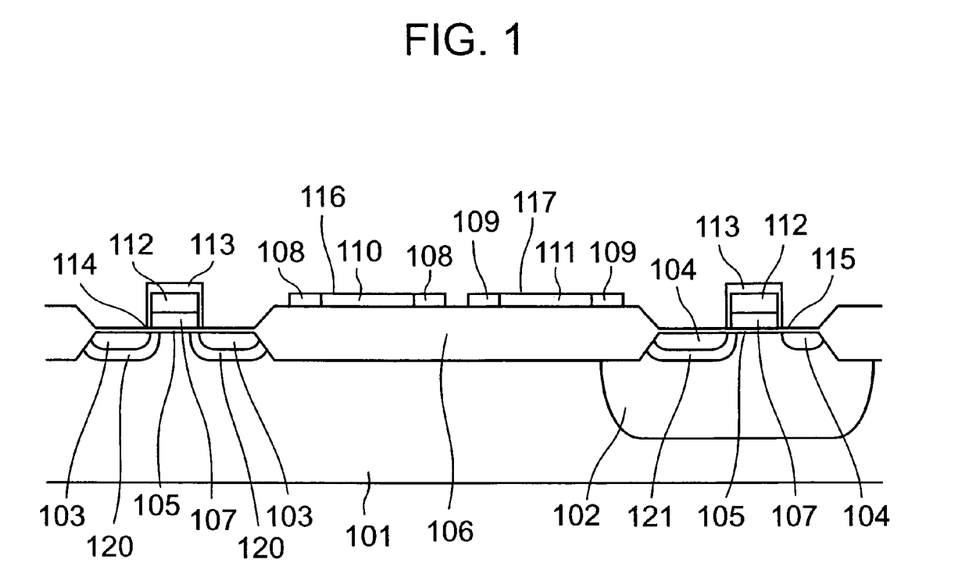
FIG. 1 is a schematic cross sectional view showing a CMOS semiconductor device according to an embodiment of the present invention.

Hereinafter, an embodiment of the present invention will be described in detail with reference to the drawings. FIG. 1 is a cross sectional view showing a CMOS semiconductor device having a resistor circuit according to an embodiment of the present invention.

In this embodiment, an N-type well diffusion layer region 102 is formed in a P-type silicon semiconductor substrate 101 and has a conductivity type opposite to the substrate. Further, impurity diffusion layers each having a conductivity type opposite to the silicon semiconductor substrate 101 are formed therein for an N-type MOS transistor 114. Impurity diffusion layers each having a conductivity type opposite to the N-type well diffusion layer region 102 are formed therein for a P-type MOS transistor 115. Each of the transistors is composed of a gate insulating film 105 and a gate electrode in addition to the impurity diffusion layer. The gate electrode has a laminate polycide structure of a P$^+$-type polycrystalline silicon film 107 and a high melting point metallic silicide film 112. An oxide insulating film 113 is deposited on the gate electrode as a mask member therefor. Here, a nitride film may be used as the mask member for the gate electrode. In addition, the P-type silicon semiconductor substrate is used here. However, a P-type well diffusion layer may be formed in an N-type silicon substrate so as to construct a CMOS semiconductor device thereto.

Also, in this embodiment, a polycrystalline silicon resistor 116 which is made from a second polycrystalline silicon film and has an N-type as a first conductivity type and a polycrystalline silicon resistor 117 which is made from the second polycrystalline silicon film and has a P-type as a second conductivity type are formed on a field insulating film 106. Here, the polycrystalline silicon film 107 as a portion of the gate electrode in the CMOS transistor and the polycrystalline silicon resistors 116 and 117 are formed in separate steps and have different film thicknesses. The polycrystalline silicon resistors are formed to be thinner than the gate electrode. For example, the film thickness of the gate electrode is about 2000 Å to 6000 Å. On the other hand, the film thickness of each resistor is 500 Å to 2500 Å. When the polycrystalline silicon resistors are thin, a high sheet resistance value can be set and a temperature characteristic becomes preferable. Thus, the accuracy of resistor can be further improved.

The N-type polycrystalline silicon resistor 116 includes a high resistance region 110 and high concentration impurity regions 108 which are provided in both end portions of the resistor such that they are in sufficient contact with wiring members. The impurity concentration of the high resistance region 110 is controlled by ion implantation, thereby forming the resistors each having a desirable resistance value. Similarly, the P-type polycrystalline silicon resistor 117 includes a high resistance region 111 and high concentration impurity regions 109. A resistance value is set in accordance with the impurity concentration of the high resistance region.

For example, a sheet resistance value is dependent on a use of the resistor. In the case of a general voltage dividing circuit, the sheet resistance value from several kΩ/square to several tens kΩ/square is used. At this time, boron or BF$_2$ is used as an impurity for the P$^-$-type resistor 117 and the concentration thereof is about $1 \times 10^{14}$ to $9 \times 10^{18}$ atoms/cm$^3$. Phosphorus or arsenic is used as an impurity for the N-type resistor 116 and the concentration thereof is about $1 \times 10^{14}$ to $9 \times 10^{18}$ atoms/cm$^3$.

Also, both the N-type resistor 116 and the P-type resistor 117 are shown in FIG. 1. However, in order to reduce the number of steps and costs in view of features of those resistors and characteristics thereof required for a product, there is the case where only one of the N-type resistor 116 and the P-type resistor 117 is mounted.

Thus, when the gate electrode is set to be the P$^+$-type, the PMOS transistor becomes the surface channel type PMOS transistor. Therefore, even when the threshold voltage is reduced, a leak current can be suppressed as compared with the buried channel type transistor. On the other hand, in the case of the NMOS transistor, when the gate electrode is set to be the P$^+$-type, it becomes the buried channel type NMOS transistor. Here, arsenic having a smaller diffusion coefficient than boron is used as an impurity to be implanted for reducing the threshold voltage. Thus, the NMOS transistor becomes a state similar to the surface channel type transistor as compared with the PMOS transistor using an N$^+$-type gate electrode. In addition, arsenic has the property of condensing near an interface between the silicon film and the oxide film. Therefore, the NMOS transistor further approaches a state similar to the surface channel type transistor. As a result, even when the threshold voltage is reduced in the N-type MOS transistor, a leak current can be suppressed and low voltage operation is possible. With respect to the homopolar gate structure, when the respective gate electrodes of the N-type MOS transistor and the P-type MOS transistor are set to be the P$^+$-type, manufacturing steps are thereby simplified and costs can be reduced.

Further, in FIG. 1, for the purpose of improvement of channel length modulation, suppression of reduction in reliability resulting from a hot carrier, and improvement of a drain withstand voltage, which are important for an analog circuit, a MOS transistor structure is used which is a so-called double diffused drain (DDD) structure in which low concentration impurity diffusion layers N 120 and P 121 overlapped with the gate electrode are located in both the source and the drain and high concentration impurity diffusion layers N+ 103 and P+ 104 overlapped with the gate electrode are located in the source and the drain or in only the drain. According to this structure, the high concentration impurity diffusion layers are overlapped with the gate electrode so that there is a merit in that a parasitic resistance at operation of the MOS can be made small by the overlap.

The structure shown in FIG. 1 is formed by selectively forming, for example, low concentration impurity diffusion layers using an ion implantation method and heat treatment and then providing high concentration impurity diffusion layers. With respect to the low concentration impurity diffusion layers, in the case of N 120 of the NMOS transistor 114, phosphorus or arsenic is used as an impurity and the concentration is about $1 \times 10^{16}$ to $1 \times 10^{18}$ atoms/cm$^3$. In the case of P 121 of the PMOS transistor 115, boron or BF$_2$ is used as an impurity and the concentration is about $1 \times 10^{16}$ to $1 \times 10^{18}$ atoms/cm$^3$. With respect to the high concentration impurity diffusion layers, in the case of N+ 103 of the NMOS transistor 114, phosphorus or arsenic is used as an impurity and the concentration is $1 \times 10^{19}$ atoms/cm$^3$ or more. In the case of P+ 104 of the PMOS transistor 115, boron or BF$_2$ is used as an impurity and the concentration is about $1 \times 10^{19}$ atoms/cm$^3$ or more.

The difference of the amount of transverse diffusion toward a channel side between the light diffusion layers N 120 and P 121 and the heavy diffusion layers N+ 103 and P+ 104 is generally about 0.2 μm to 1 μm. In FIG. 1, only one side of the PMOS transistor 115 becomes a DDD structure and both sides of the NMOS transistor 114 each become a DDD structure. However, according to a method of using an element in a circuit, a structure suitable for the circuit can be selected regardless of a MOS transistor conductive type. Normally, when a current direction is bidirectional and the source and the drain are replaced according to the case so that a withstand voltage is required for both directions, both the source and the drain are made to have the DDD structure. When a current direction is a single direction and the source and the drain are fixed, one side, that is, only the drain side is made to have the DDD structure in order to shorten an effective channel length.

From the above-mentioned description, a method of manufacturing the CMOS transistor using a P$^+$-type polycrystalline silicon unipole as the gate electrode according to the present invention is a technique effective in low voltage operation and low power consumption as compared with a method of manufacturing a conventional CMOS transistor using an N$^+$-type polycrystalline silicon unipole as the gate electrode. Further, the semiconductor device includes the polycrystalline silicon resistor different from the gate electrode and an offset structure transistor, thereby further enabling high grade function and high accuracy which are necessary for the analog circuit.

Next, steps of manufacturing the semiconductor device of the embodiment shown in FIG. 1 will be described based on FIGS. 2 to 11.

Figure 2:
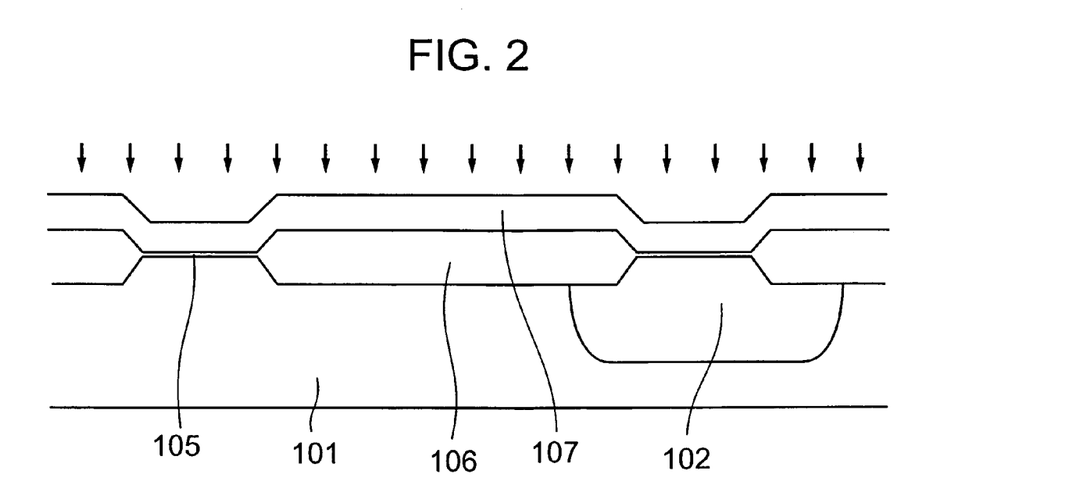
FIG. 2 is a cross sectional view showing a method of manufacturing the CMOS semiconductor device in step order according to the present invention.
Figure 3:
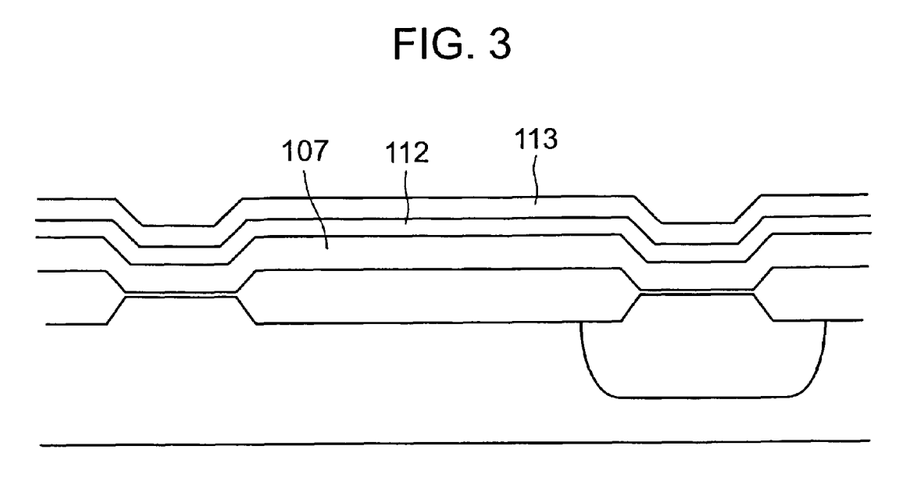
FIG. 3 is a cross sectional view showing a method of manufacturing the CMOS semiconductor device in step order according to the present invention.

For example, phosphorus ions are implanted into the P-type silicon semiconductor substrate 101 and annealing is performed at 1000° C. to 1175° C. for 3 hours to 20 hours. Thus, the phosphorus ions are diffused to form the N-type well diffusion layer 102 having an impurity concentration of about $1\times10^{16}$ atoms/cm$^3$. Subsequently, the field insulating film 106 is formed by a LOCOS method, the gate insulating film 105 is formed at a film thickness of about 100 Å to 300 Å by thermal oxidation, and ion implantation is performed for obtaining a predetermined threshold voltage. After that, a first polycrystalline silicon film is deposited at a film thickness of about 500 Å to 2500 Å by a low pressure CVD method. Then, boron ions or BF$_2$ ions are implanted into this first polycrystalline silicon film such that the impurity concentration thereof is equal to or higher than $1\times10^{18}$ atoms/cm$^3$, thereby forming the P$^+$-type polycrystalline silicon film 107 (FIG. 2).

Figure 4:
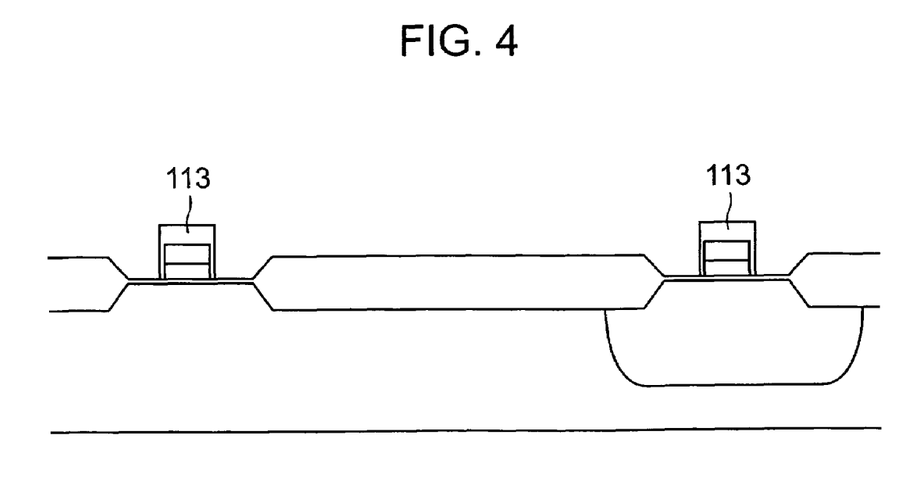
FIG. 4 is a cross sectional view showing a method of manufacturing the CMOS semiconductor device in step order according to the present invention.

Here, the P$^+$-type polycrystalline silicon film is formed by ion implantation. However, the P$^+$-type polycrystalline silicon film may be formed by a doped-CVD method of depositing a polycrystalline silicon film while an impurity such as boron is mixed thereinto at the same time. After that, a tungsten silicide film 112 as the high melting point metallic silicide film is deposited on the P$^+$-type polycrystalline silicon film by a sputtering method or the like. Note that, here, the tungsten silicide film is used as the high melting point metallic silicide film. However, a molybdenum silicide film, a titanium silicide film, or a platinum silicide film can be also used. Then, the oxide insulating film 113 as a mask member for preventing introduction of an N-type impurity into a P$^+$-type gate electrode is deposited on the high melting point metallic silicide film 112 at 500 Å to 3000 Å by the low pressure CVD method (FIG. 3) and patterned using a photo resist to form the P$^+$-type gate electrode. Here, a nitride film may be used as the mask member. Then, an oxide film is formed at 100 Å to 500 Å to a gate electrode portion and on the surface of the semiconductor substrate by thermal oxidation, the low pressure CVD method, or the like (FIG. 4).

In addition, here, as the insulating film 113 on the P$^+$-type gate electrode, an insulating film having a laminate structure of an oxide film having a film thickness of, for example, 300 Å, a nitride film having a film thickness of 500 Å, which is formed by a CVD method, and a thermal oxide film having a film thickness of about 10 Å may be formed for forming a high quality capacitor.

Figure 5:
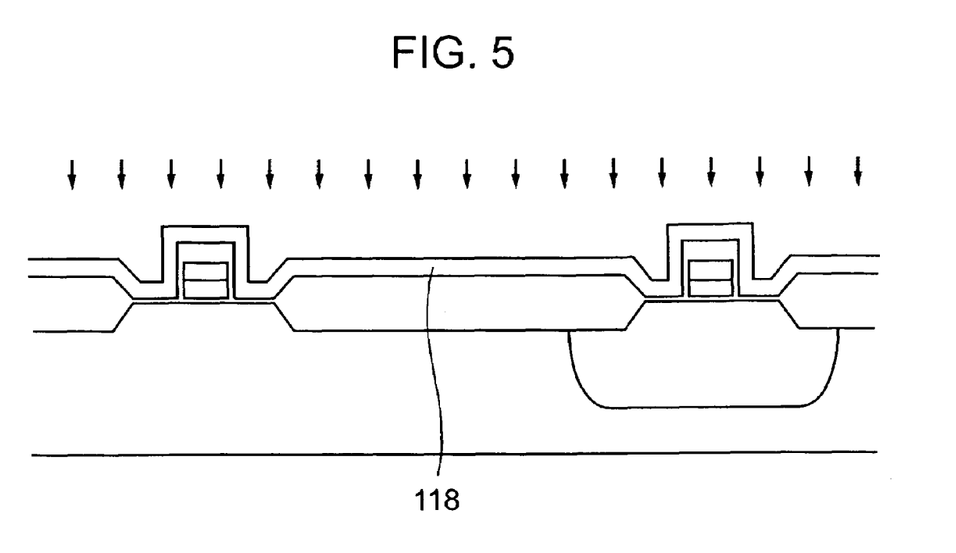
FIG. 5 is a cross sectional view showing a method of manufacturing the CMOS semiconductor device in step order according to the present invention.

Next, as shown in FIG. 5, a second polycrystalline silicon film 118 having a film thickness of, for example, 1000 Å is deposited on the entire surface by the CVD method or the sputtering method. Then, in order to form a low concentration P-type resistor, BF$_2$ ions as P-type impurities are implanted into the entire second polycrystalline silicon film 118 at a dose of, for example, $1\times10^{14}$ atoms/cm$^2$. Note that boron may be used instead of BF$_2$.

Figure 6:
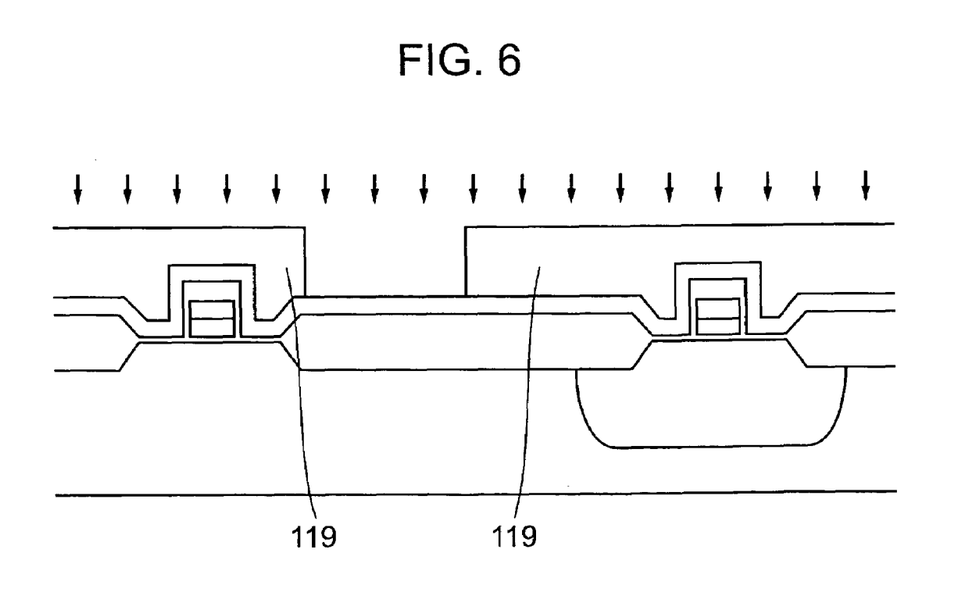
FIG. 6 is a cross sectional view showing a method of manufacturing the CMOS semiconductor device in step order according to the present invention.

After that, as shown in FIG. 6, the second polycrystalline silicon film 118 is patterned using a photo resist 119 so as to form a low concentration N-type resistor region later and phosphorus ions are selectively implanted at a dose of, for example, $3\times10^{14}$ atoms/cm$^2$. At this time, in order to form the N-type resistor with stability, it is required that the dose of phosphorus is set to be equal to or more than two times that of BF$_2$. Note that arsenic may be used instead of phosphorus. Thus, when boron for setting a sheet resistance value of the P-type resistor is introduced in advance into a polycrystalline silicon resistor region which becomes the N-type later and it is reinjected to the N-type resistor region later using phosphorus or arsenic as the N-type impurity, the sheet resistance value can be effectively increased. Note that a method of separately performing ion implantation to the P-type resistor region and the N-type resistor region using respective masks made of a photo resist or the like may be used.

Figure 7:
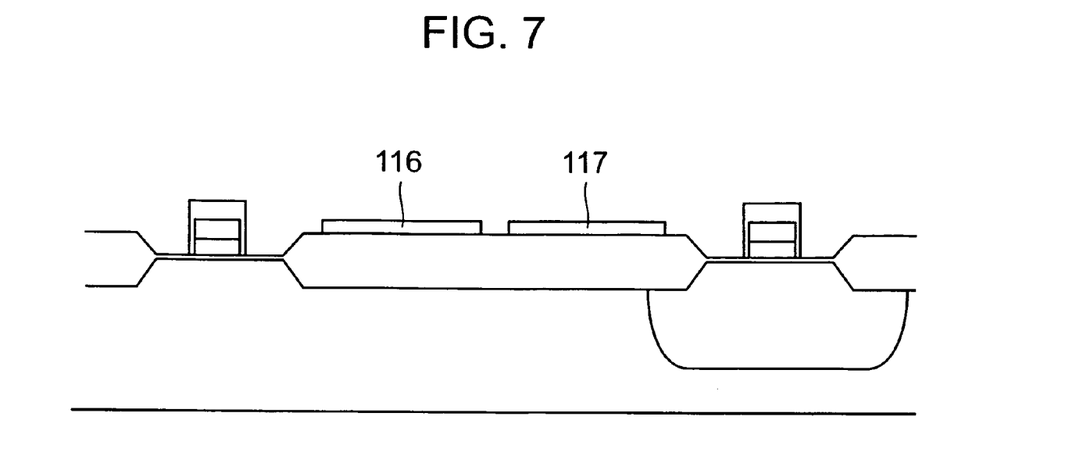
FIG. 7 is a cross sectional view showing a method of manufacturing the CMOS semiconductor device in step order according to the present invention.

After that, the photo resist 119 is removed, and then patterning is performed using a photo resist and RIE anisotropic dry etching is performed, thereby forming the polycrystalline silicon resistor 116 having the N-type as the first conductivity type and the polycrystalline silicon resistor 117 having the P-type as the second conductivity type, as shown in FIG. 7.

Figure 8:
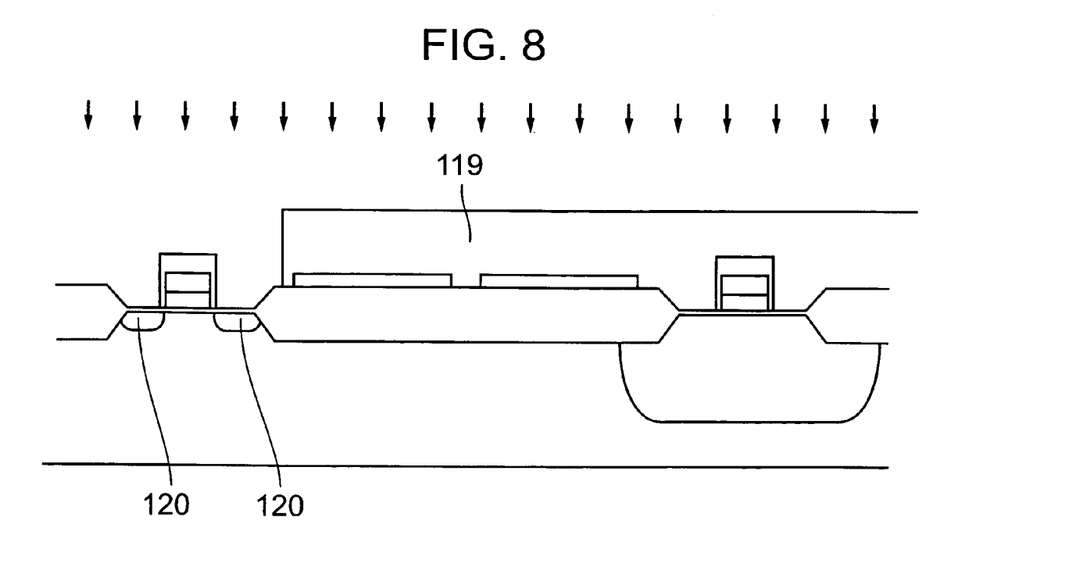
FIG. 8 is a cross sectional view showing a method of manufacturing the CMOS semiconductor device in step order according to the present invention.

Next, as shown in FIG. 8, the photo resist 119 is patterned, arsenic or phosphorus as an N-type impurity is doped by the ion implantation method such that an impurity concentration becomes about $1\times10^{16}$ to $1\times10^{18}$ atoms/cm$^3$, thereby forming N-type low concentration impurity regions 120 as the source and the drain of the NMOS transistor. In addition, it is possible that the introduction of the N-type impurity for the second polycrystalline silicon resistor is omitted in FIG. 6 and that the N-type low concentration impurity in FIG. 8 is doped into the entire region of the N-type resistor to form a high resistance N-type resistor instead.

Figure 9:
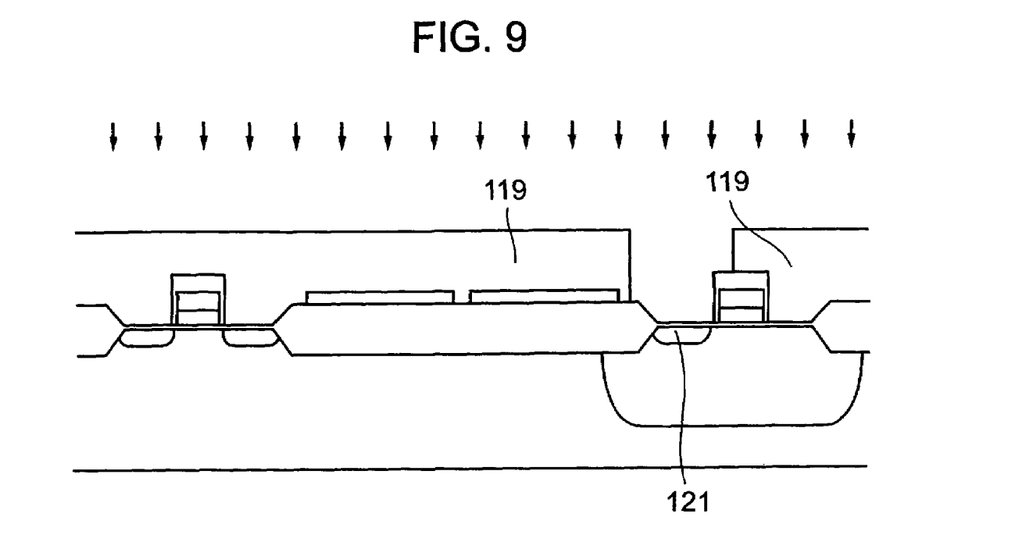
FIG. 9 is a cross sectional view showing a method of manufacturing the CMOS semiconductor device in step order according to the present invention.

After the removal of the photo resist, as shown in FIG. 9, a new photo resist 119 is patterned, boron or BF$_2$ as a P-type impurity is doped by the ion implantation method such that an impurity concentration becomes about $1\times10^{16}$ to $1\times10^{18}$ atoms/cm$^3$, thereby forming a P-type low concentration impurity region 121 as the drain of the PMOS transistor. At this time, if necessary, a low concentration impurity diffusion layer may be formed also in the source. In addition, it is possible that the introduction of the P-type impurity for the second polycrystalline silicon resistor is omitted in FIG. 5 and that the P-type low concentration impurity in FIG. 9 is doped into the entire region of the P-type resistor to form a high resistance P-type resistor instead.

Figure 10:
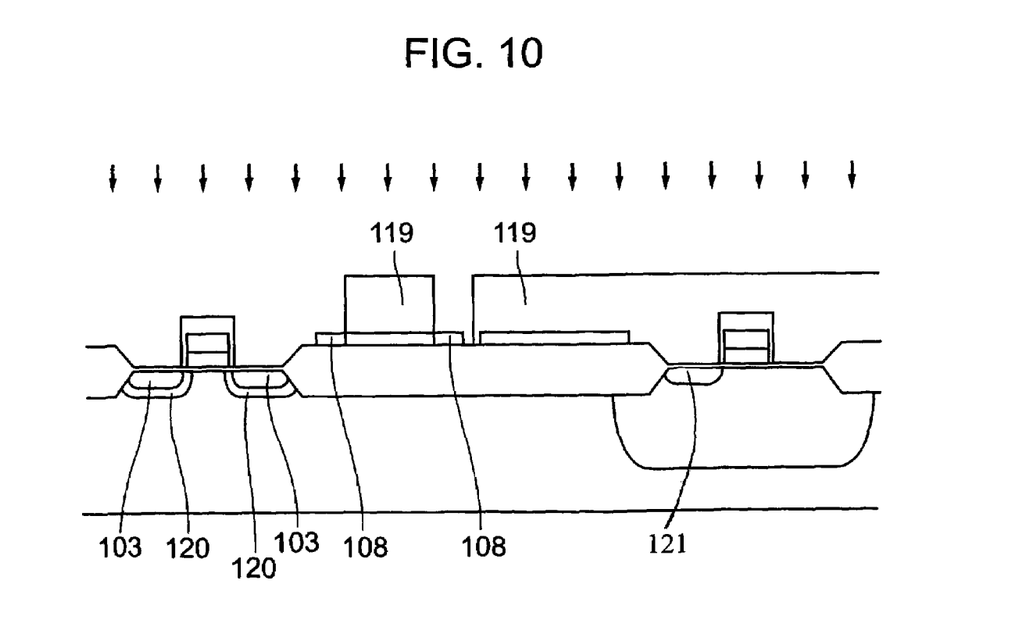
FIG. 10 is a cross sectional view showing a method of manufacturing the CMOS semiconductor device in step order according to the present invention.

Next, as shown in FIG. 10, patterning is performed using the photo resist 119 and arsenic as the N-type impurity is doped at a dose of $5\times10^{15}$ atoms/cm$^2$ by the ion implantation method. As a result, the high concentration impurity regions 108 for sufficiently contacting an aluminum wiring in the second polycrystalline silicon resistor 116 having the N-type as the first conductivity type and N-type high concentration impurity regions 103 to be the source and the drain of the NMOS transistor are simultaneously formed. Instead of the introduction of the N-type impurity into the second polycrystalline silicon resistor as shown in FIG. 4 and FIG. 8 which is omitted, the N-type high concentration impurity in FIG. 9 can be doped into the entire region of the N-type resistor to form the N-type resistor having a relatively low resistance.

Figure 11:
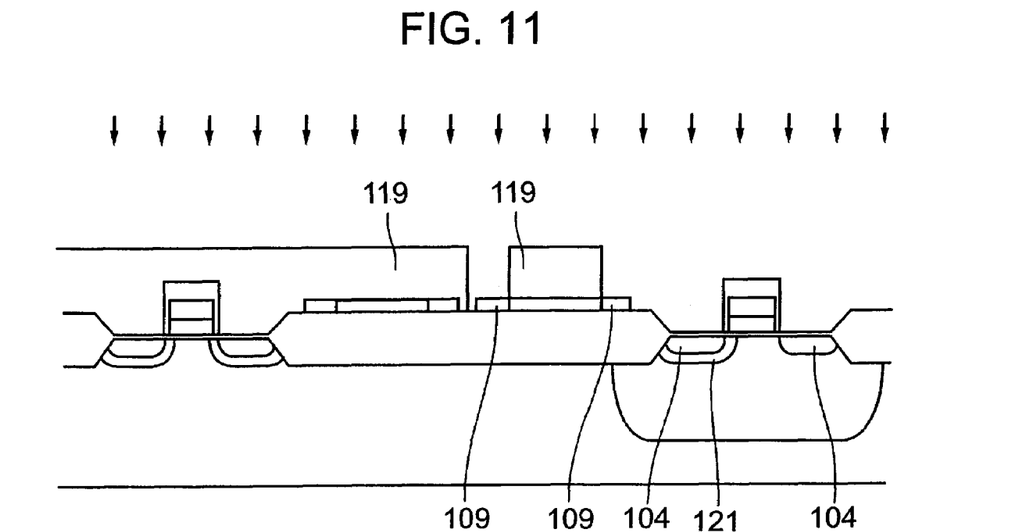
FIG. 11 is a cross sectional view showing a method of manufacturing the CMOS semiconductor device in step order according to the present invention.

Then, after the photo resist is removed, as shown in FIG. 11, patterning is performed using a photo resist 119 and BF$_2$ as the P-type impurity is doped at a dose of $5\times10^{15}$ atoms/cm$^2$ by the ion implantation method. As a result, the high concentration impurity regions 109 for sufficiently contacting the aluminum wiring in the second polycrystalline silicon resistor 117 having the P-type as the second conductivity type and P-type high concentration impurity regions 104 to be the source and the drain of the PMOS transistor are simultaneously formed. In FIG. 11, the P-type high concentration impurity can be doped into the entire region of the P-type resistor to form the P-type resistor having a relatively low resistance.

After that, although not shown, as in a conventional semiconductor process, formation of an intermediate insulating film, formation of contact holes, formation of an aluminum wiring pattern, and formation of a protective film and patterning thereof are performed to produce the complementary MOS semiconductor device.

Thus, the embodiment mode of the present invention is described based on the embodiment using the P-type semiconductor substrate. Even when the polarity of the substrate is reversed and the P$^+$-type unipolar gate CMOS transistor of N-substrate P-well type is produced using the N-type semiconductor substrate, a semiconductor device achieving low voltage operation, low power consumption, and a low cost can be provided as in contents and principles as described above.

As described above, with respect to a power management semiconductor device and an analog semiconductor device which each include a CMOS transistor and a resistor, a manufacturing method of the present invention is a method of obtaining a P-type polycide structure as a laminate structure of a P-type polycrystalline silicon film and a high melting point metallic silicide film for the respective gate electrodes of both the NMOS transistor and the PMOS transistor as divided by the conductivity type thereof in the CMOS transistor, and further a semiconductor device manufacturing method in which a resistor used for a voltage dividing circuit and a CR circuit is formed by using a polycrystalline silicon film as a layer different from the gate electrode so that a higher accurate resistor can be obtained. Consequently, as compared with a conventional CMOS transistor having an N$^+$-type polycrystalline silicon gate unipole and a conventional homopolar gate CMOS transistor in which the channel and the gate electrode have the same polarity, there is advantages in costs, manufacturing periods, and element performances. In addition, a power management semiconductor device and an analog semiconductor device which have high grade function and high accuracy can be realized.

The invention claimed is:

1. A method of manufacturing a semiconductor device, comprising the steps of:

forming an element isolation insulating film on a semiconductor substrate by thermal oxidation;

forming a gate insulating film on the semiconductor substrate by thermal oxidation;

depositing on the gate insulating film a first polycrystalline silicon film having a thickness in the range of 500 Å to 2500 Å;

doping the entire first polycrystalline silicon film with an impurity having a concentration of $1\times10^{18}$ atoms/cm$^3$ or higher to provide the entire first polycrystalline silicon film with a P-type conductivity;

depositing a high melting point silicide film having a thickness in the range of 500 Å to 2500 Å on the P-type first polycrystalline silicon film;

depositing an insulating film having a thickness in the range of 500 Å to 3000 Å on the high melting point metallic silicide film;

etching the P-type first polycrystalline silicon film, the high melting point metallic silicide film, and the insulating film to form a gate electrode with a P-type conductivity;

depositing on the element isolation insulating film a second polycrystalline silicon film different from the first polycrystalline silicon film and having a thickness in the range of 500 Å to 2500 Å;

doping a first region of the second polycrystalline silicon film with a first conductivity type impurity at a concentration in the range of $1\times10^{14}$ to $9\times10^{18}$ atoms/cm$^3$;

doping a second region of the second polycrystalline silicon film with a second conductivity type impurity at a concentration in the range of $1\times10^{14}$ to $9\times10^{18}$ atoms/cm$^3$;

etching the second polycrystalline silicon film to form on the first and second regions thereof first and second resistors, respectively, each composed of the second polycrystalline silicon film and having a thickness smaller than that of the gate electrode, the first and second resistors having the first and second conductivity types, respectively;

doping a low concentration diffusion region of a first conductivity type MOS transistor with the first conductivity type impurity at a concentration in the range of $1\times10^{16}$ to $1\times10^{18}$ atoms/cm$^3$;

doping a low concentration diffusion region of a second conductivity type MOS transistor with the second conductivity type impurity at a concentration in the range of $1\times10^{16}$ to $1\times10^{18}$ atoms/cm$^3$;

performing heat treatment so that the low concentration diffusion region of the first conductivity type MOS transistor and the low concentration diffusion region of the second conductivity type MOS transistor have a region overlapped with the gate electrode;

doping portions of the first resistor with the first conductivity type impurity at a concentration of $1\times10^{19}$ atoms/cm$^3$ or higher to form high concentration impurity regions having the first conductivity type;

doping portions of the second resistor with the second conductivity type impurity at a concentration of $1\times10^{19}$ atoms/cm$^3$ or higher to form high concentration impurity regions having the second conductivity type;

forming an intermediate insulating film over the semiconductor substrate;

forming a contact hole in the intermediate insulating film; and providing a metallic wiring in the contact hole.

2. A method of manufacturing a semiconductor device as set forth in claim 1; wherein the step of doping the first polycrystalline silicon film with an impurity comprises a step for ion implantation of boron.

3. A method of manufacturing a semiconductor device as set forth in claim 1; wherein the step of doping the first polycrystalline silicon film with an impurity comprises a step for ion implantation of BF$_2$.

4. A method of manufacturing a semiconductor device as set forth in claim 1; wherein the step of doping the first polycrystalline silicon film with an impurity comprises the step of mixing the impurity into the first polycrystalline silicon film during the step of depositing the first polycrystalline silicon film.

5. A method of manufacturing a semiconductor device as set forth in claim 1; wherein the insulating film deposited on the high melting point metallic silicide film comprises an oxide film.

6. A method of manufacturing a semiconductor device as set forth in claim 1; wherein the insulating film comprises a nitride film.

7. A method of manufacturing a semiconductor device as set forth in claim 1; wherein the insulating film comprises a laminate structure containing a first oxide film, a nitride film, and a second oxide film different from the first oxide film.

8. A method of manufacturing a semiconductor device as set forth in claim 1; wherein the step of doping the portion of first region of the second polycrystalline silicon film with the first conductivity type impurity at a concentration of $1\times10^{19}$ atoms/cm$^3$ or higher is performed simultaneously with a step of doping a high concentration diffusion region of the first conductivity type MOS transistor; and wherein the step of doping the portion of the second region of the second polycrystalline film with the second conductivity type impurity at a concentration of $1\times10^{19}$ atoms/cm$^3$ or higher is performed simultaneously with a step of doping a high concentration diffusion region of the second conductivity type MOS transistor.

9. A method of manufacturing a semiconductor device, comprising the steps of:
   forming an element isolation insulating film on a semiconductor substrate;
   forming a gate insulating film on the semiconductor substrate;
   depositing on the gate insulating film a first polycrystalline silicon film having a thickness in the range of 500 Å to 2500 Å;
   doping each gate electrode forming portion of the first polycrystalline silicon film with a P-type impurity to form each of the gate electrode forming portions of the first polycrystalline silicon film with a P-type conductivity;
   depositing a high melting point silicide film having a thickness in the range of 500 Å to 2500 Å on the P-type first polycrystalline silicon film;
   depositing an insulating film having a thickness in the range of 500 Å to 3000 Å on the high melting point metallic silicide film;
   etching the P-type first polycrystalline silicon film, the high melting point metallic silicide film, and the insulating film to form a gate electrode with a P-type conductivity;
   depositing on the element isolation insulating film a second polycrystalline silicon film different from the P-type first polycrystalline silicon film and having a thickness in the range of 500 Å to 2500 Å;
   doping a first region of the second polycrystalline silicon film with a first conductivity type impurity;
   doping a second region of the second polycrystalline silicon film with a second conductivity type impurity;
   etching the second polycrystalline silicon film to form on the first and second regions thereof first and second resistors, respectively, each composed of the second polycrystalline silicon film and having a thickness smaller than a thickness of the gate electrode, the first and second resistors having the first and second conductivity types, respectively;
   doping a low concentration diffusion region of a first conductivity type MOS transistor with the first conductivity type impurity;
   doping a low concentration diffusion region of a second conductivity type MOS transistor with the second conductivity type impurity;
   performing heat treatment so that the low concentration diffusion region of the first conductivity type MOS transistor and the low concentration diffusion region of the second conductivity type MOS transistor have a region overlapped with the gate electrode;
   doping portions of the first resistor with the first conductivity type impurity to form high concentration impurity regions having the first conductivity type;
   doping portions of the second resistor with the second conductivity type impurity to form high concentration impurity regions having the second conductivity type;
   forming an intermediate insulating film over the semiconductor substrate;
   forming a contact hole in the intermediate insulating film; and
   providing a metallic wiring in the contact hole.

10. A method of manufacturing a semiconductor device as set forth in claim 9; wherein the step of doping the first polycrystalline silicon film with an impurity comprises the step of doping the first polycrystalline silicon film with boron.

11. A method of manufacturing a semiconductor device as set forth in claim 9; wherein the step of doping the first polycrystalline silicon film with an impurity comprises the step of doping the first polycrystalline silicon film with $BF_2$.

12. A method of manufacturing a semiconductor device as set forth in claim 9; wherein the step of doping the first polycrystalline silicon film with an impurity comprises the step of mixing the impurity into the first polycrystalline silicon film during the step of depositing the first polycrystalline silicon film.

13. A method of manufacturing a semiconductor device as set forth in claim 9; wherein the insulating film deposited on the high melting point metallic silicide film comprises an oxide film.

14. A method of manufacturing a semiconductor device as set forth in claim 9; wherein the insulating film deposited on the high melting point metallic silicide film comprises a nitride film.

15. A method of manufacturing a semiconductor device as set forth in claim 9; wherein the insulating film deposited on the high melting point metallic silicide film comprises a laminate structure containing a first oxide film, a nitride film, and a second oxide film different from the first oxide film.

16. A method of manufacturing a semiconductor device according to claim 1; wherein the resistors having the respective first and second conductivity types are formed in different steps and with a different thickness than the first polycrystalline silicon film.

17. A method of manufacturing a semiconductor device according to claim 1; wherein the resistors having the respective first and second conductivity types are formed with a smaller thickness than the gate electrode.

18. A method of manufacturing a semiconductor device according to claim 9; wherein the resistors having the respective first and second conductivity types are formed in different steps and with a different thickness than the first polycrystalline silicon film.

19. A method of manufacturing a semiconductor device according to claim 9; wherein the resistors having the respective first and second conductivity types are formed with a smaller thickness than the gate electrode.

* * * * *